United States Patent
Chung et al.

(10) Patent No.: US 7,626,260 B2
(45) Date of Patent: Dec. 1, 2009

(54) STACK-TYPE SEMICONDUCTOR DEVICE HAVING COOLING PATH ON ITS BOTTOM SURFACE

(75) Inventors: Hyun-Soo Chung, Gyeonggi-do (KR); Cha-Jea Jo, Gyeonggi-do (KR); Dong-Ho Lee, Gyeonggi-do (KR); Seong-Deok Hwang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 156 days.

(21) Appl. No.: 11/751,464

(22) Filed: May 21, 2007

(65) Prior Publication Data

US 2007/0267738 A1 Nov. 22, 2007

(30) Foreign Application Priority Data

May 22, 2006 (KR) .................. 10-2006-0045814

(51) Int. Cl.
*H01L 23/34* (2006.01)
(52) U.S. Cl. .................. 257/712; 257/686; 257/E23.097
(58) Field of Classification Search .................. 257/686, 257/712, 713, 714, E23.097, E23.098, E23.099
See application file for complete search history.

(56) References Cited

U.S. PATENT DOCUMENTS

| 6,219,237 | B1 * | 4/2001 | Geusic et al. | 361/699 |
| 6,577,013 | B1 * | 6/2003 | Glenn et al. | 257/777 |
| 2003/0006494 | A1 * | 1/2003 | Lee et al. | 257/686 |
| 2004/0145044 | A1 * | 7/2004 | Sugaya et al. | 257/698 |

FOREIGN PATENT DOCUMENTS

| JP | 2003-078106 | 3/2003 |
| KR | 2004-0083985 | 10/2004 |
| KR | 2005-0037679 | 4/2005 |

OTHER PUBLICATIONS

English language abstract of Japanese Publication No. 2003-078106, Mar. 14, 2003.
English language abstract of Korean Publication No. 2004-0083985, Oct. 6, 2004.
English language abstract of Korean Publication No. 2005-0037679, Apr. 25, 2005.

* cited by examiner

*Primary Examiner*—Victor A Mandala
*Assistant Examiner*—Scott Stowe
(74) *Attorney, Agent, or Firm*—Volentine & Whitt, PLLC (57) ABSTRACT

Provided is a semiconductor device having a cooling path on its bottom surface. The stack-type semiconductor device having a cooling path comprises a stack-type semiconductor chip comprising a first semiconductor chip and a second semiconductor chip. The first semiconductor chip comprises a first surface in which a circuit unit is formed and a second surface in which a first cooling path is formed, and the second semiconductor chip comprises a first surface in which a circuit unit is formed and a second surface in which a second cooling path is formed. The second surface of the first semiconductor chip and the second surface of the second semiconductor chip are bonded to each other, and a third cooling path is formed in the middle of the stack-type semiconductor chip using the first and second cooling paths. Warpage of the stack-type semiconductor device is suppressed and heat is easily dissipated.

15 Claims, 6 Drawing Sheets

STACK-TYPE SEMICONDUCTOR DEVICE HAVING COOLING PATH ON ITS BOTTOM SURFACE

CROSS-REFERENCE TO RELATED PATENT APPLICATIONS

This application claims the benefit of Korean Patent Application No. 10-2006-0045814, filed on May 22, 2006, in the Korean Intellectual Property Office, the disclosure of which is incorporated herein by reference in its entirety.

BACKGROUND

1. Technical Field

The invention relates to a semiconductor device, and more particularly, to a semiconductor device which includes a vertical interconnection and provides an enhanced heat dissipation path, and a stack-type semiconductor device with an enhanced heat dissipation path.

2. Description of the Related Art

Electronic products are being made increasingly smaller, lighter, and more powerful. Recently, there have been many changes in the development of semiconductor devices to allow these improvements.

For instance, in order to reduce the size of electronic products, the integration of semiconductor devices has been increased. However, improving the integration of the semiconductor devices requires enormous cost, extensive research, and complicated equipment development. In another approach, a technology has been developed to increase the integration of a semiconductor device by stacking semiconductor chips or semiconductor packages based on a memory device. Stacking semiconductor chips or packages ameliorates some of the challenges of increasing the integration of semiconductor devices, but stacking still requires significant cost and research.

Such stack-type semiconductor devices have increasingly used internal wire connections using solder bumps or vertical interconnections, instead of the traditional wire bonding. However, connections using solder bumps or vertical interconnections prevent effective dissipation of the heat generated by the densely packed semiconductor chips.

When heat is not effectively dissipated from the semiconductor chips, the electrical characteristics of the semiconductor chips may be degraded. This problem becomes more severe as the number of stacked semiconductor chips increases. Thus, this heat dissipation problem must be solved to increase the number of stacked semiconductor chips in a stack-type semiconductor device, and thereby increase the integration of the semiconductor devices.

SUMMARY

The invention provides a semiconductor device having an additional cooling path on its bottom surface. The invention also provides a stack-type semiconductor device having an additional cooling path inside the stack-type semiconductor device.

In one embodiment, a semiconductor device has a cooling path. The semiconductor device comprises a first surface of a semiconductor chip in which a circuit unit is disposed; and a second surface opposite the first surface of the semiconductor chip in which a cooling path having a concave shape is disposed.

BRIEF DESCRIPTION OF THE DRAWINGS

The above and other features and advantages of the invention will become more apparent by describing in detail exemplary embodiments thereof with reference to the attached drawings in which.

DETAILED DESCRIPTION

The invention will now be described more fully with reference to the accompanying drawings, in which exemplary embodiments of the invention are shown. The invention may, however, be embodied in many different forms, and should not be construed as being limited to the embodiments set forth herein; rather, these embodiments are provided so that this disclosure will be thorough and complete, and will fully convey the concept of the invention to those skilled in the art.

Figure 1:
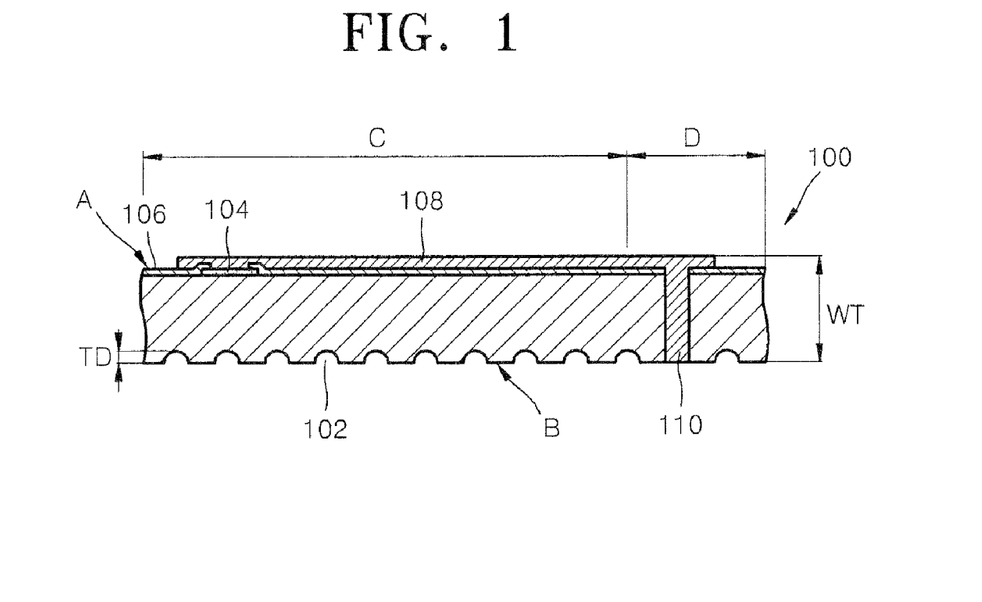
FIG. 1 is a cross-sectional view of a semiconductor device having a cooling path according to an embodiment of the invention.
Figure 2:
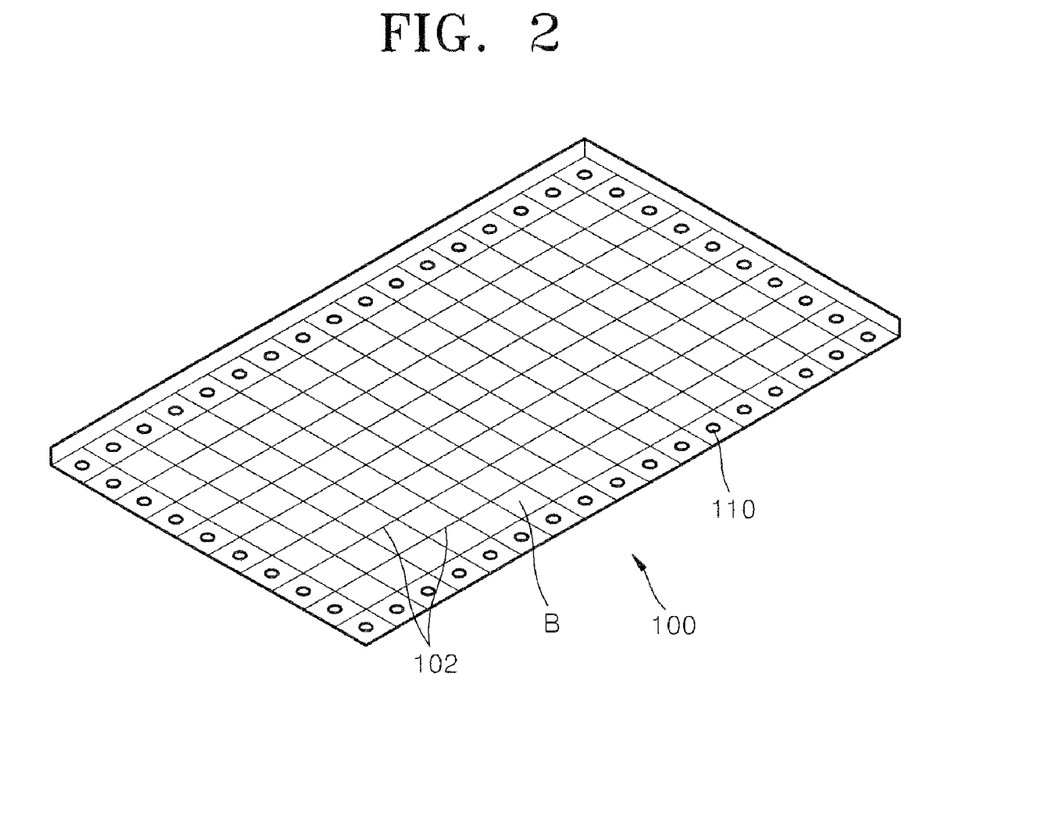
FIG. 2 is a bottom view of the semiconductor device of FIG. 1.

FIG. 1 is a cross-sectional view of a semiconductor device having a cooling path according to an embodiment of the invention, and FIG. 2 is a bottom view of the semiconductor device of FIG. 1.

Referring to FIGS. 1 and 2, a semiconductor device 100 having a cooling path according to an embodiment of the present invention includes a first surface A of a semiconductor chip 101 in which a circuit unit (not shown) is formed, and a second surface B, opposite the first surface A, in which a cooling path 102 having an engraved shape is formed. The cooling path 102 can also be described as, for example, having a concave shape or an elongate recess. However, the present invention may not be limited to such particular shapes and other shapes can be employed within the spirit and the scope of the invention as explained further below. The cooling path 102 may include a plurality of channels. Each of the channels of the cooling path 102 may have an approximately semicircular cross-section. However, the channels of the cooling path 102 may be formed in various shapes including substantially rectangular or substantially polygonal shapes.

The semiconductor device 100 having a cooling path of FIG. 1 further includes a vertical interconnection 110 that penetrates the first surface A and the second surface B. The vertical interconnection 110 is an electrical connection path between upper and lower semiconductor chips when a stack-type semiconductor device is fabricated by stacking semiconductor chips. Thus, the capacity of the semiconductor device 100 can be increased by simply stacking a plurality of semiconductor chips, without performing internal wire connections such as wire bonding. The vertical interconnection 110 may be advantageous in reducing the length and increasing the density of electrical connections in the stack-type semiconductor device.

In the semiconductor device 100, a bond pad 104 is formed on the first surface A, and a passivation layer 106 is formed on the bond pad 104 and the first surface A so as to expose a portion of the bond pad 104. In addition, the bond pad 104 is electrically connected to a pad redistribution pattern 108 which extends to a scribe lane area D of the semiconductor chip. In FIG. 1, a portion marked as C denotes an active region in which a circuit unit of the semiconductor device 100 is formed. The vertical interconnection 110 is formed in the scribe lane area D. The pad redistribution pattern 108 may be a conductive material that can be plated, such as copper, nickel or gold.

The scribe lane area D of the semiconductor device 100 is a region over which a blade passes in a sawing process. The sawing process is used to separate individual semiconductor chips from a wafer containing a plurality of semiconductor chips. In other words, the sawing process is used to separate a wafer into a plurality of individual semiconductor chips. The vertical interconnection 110 is adjacent to the active region C at both sides of the region over which the blade passes in the sawing process. The bonding pad 104 may be disposed at the edge or a central portion of the semiconductor device 100.

The thickness of the semiconductor device 100 having the cooling path 102 of FIG. 1 may be reduced by grinding the bottom surface, which is the second surface B of the semiconductor chip 101. Specifically, a back-grinding process may be used on the second surface B to reduce the thickness of the semiconductor chip 101 to a desired thickness. In this case, the thickness (WT) of the semiconductor chip 101 may be in the range of 50-100 μm and a through via depth (TD) in which the cooling path 102 is disposed may be about 1-30 μm.

As shown in FIG. 2, the cooling path 102 may form a mesh pattern in the second surface B of the semiconductor device 100. However, the cooling path 102 does not need to be a mesh pattern. For example, the cooling path 102 may run in only one direction in the second surface B of the semiconductor device 100. The cooling path 102 is a path through which heat generated in the semiconductor device is effectively dissipated to the outside when the semiconductor device 100 is stacked on a printed circuit board (PCB) or on another semiconductor device having the same shape as the PCB (see FIG. 8). In general, the semiconductor device 100 may be cooled by air flow through the cooling path 102. If necessary, another coolant such as water or oil may be used in the cooling path 102. The cooling path 102 formed in the second surface B may be formed in various shapes or patterns including a radial pattern.

Figure 3:
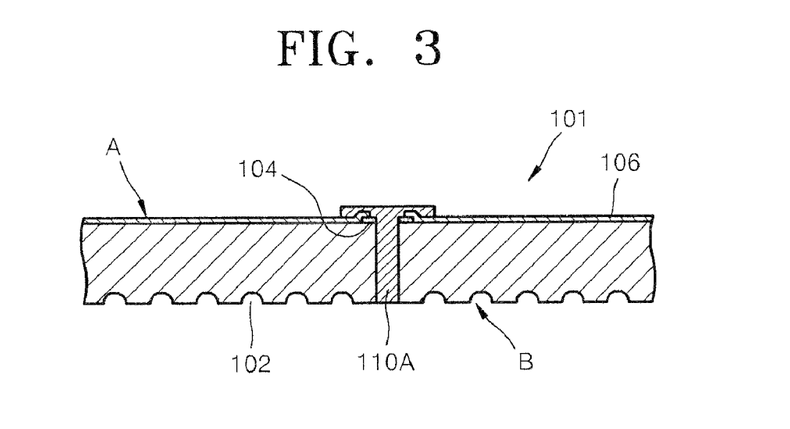
FIG. 3 is a cross-sectional view of a modified example of FIG. 1.
Figure 4:
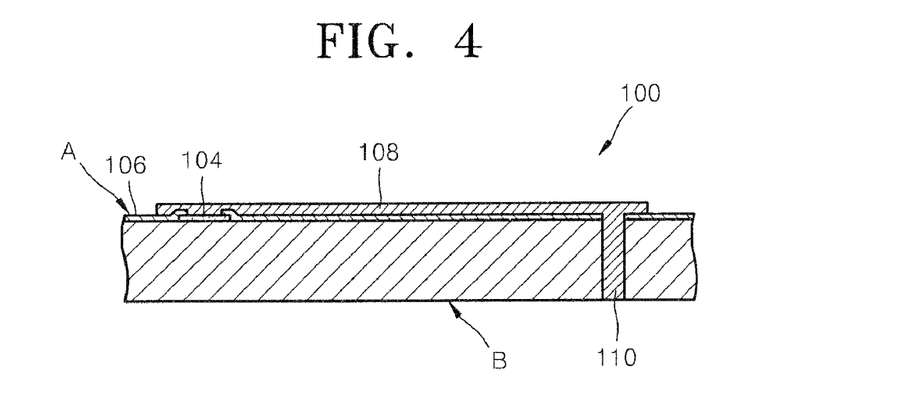
FIGS. 4 through 7 are cross-sectional views illustrating a method of fabricating a semiconductor device having a cooling path according to an embodiment of the invention.
Figure 5:
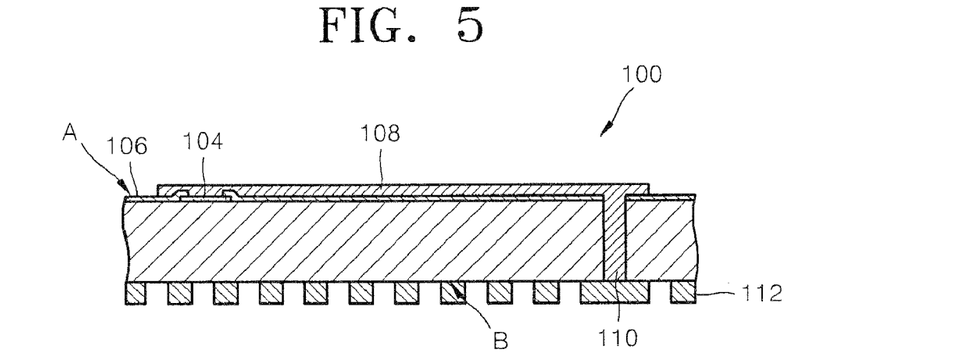
Figure 6:
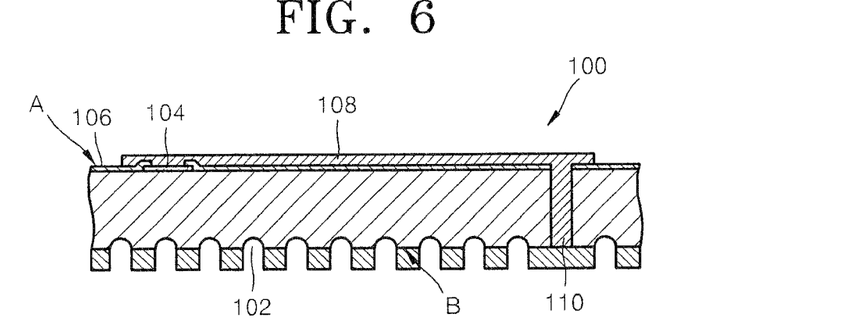
Figure 7:
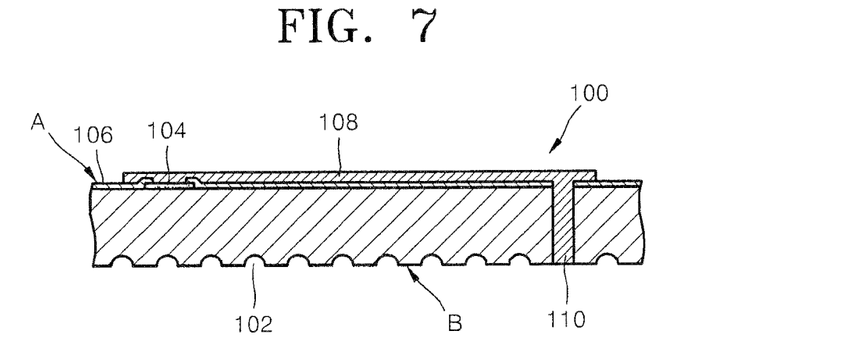

FIG. 3 is a cross-sectional view of a modified example of FIG. 1. In FIGS. 1 and 2, the vertical interconnection 110 is formed in the scribe lane region D using the pad redistribution pattern 108. However, in FIG. 3, the vertical interconnection 110 does not extend using the pad redistribution pattern 108, but a vertical interconnection 110A is formed by directly forming a through hole in the bond pad 104. This can reduce the overall size of the semiconductor device 100 having the cooling path 102.

FIGS. 4 through 7 are cross-sectional views illustrating a method of fabricating a semiconductor device having a cooling path according to an embodiment of the invention. Referring to FIGS. 4 through 7, a semiconductor device 100 having a vertical electrode 110 is prepared. The semiconductor device 100 may be in a wafer state. After that, a photoresist pattern 112 for forming a cooling path 102 is formed on the second surface B which is the bottom surface of the semiconductor device 100. Subsequently, the second surface B of the semiconductor device 100 is etched using the photoresist pattern 112 as an etch mask and an etchant or etch gas which can easily etch silicon, thereby forming the cooling path 102. Finally, the photoresist pattern 112 is removed by an ashing process and a sulfuric acid strip process, thereby leaving the cooling path 102 on the bottom surface of the semiconductor device 100.

In the present embodiment, a wet or dry etching method has been described for forming the cooling path 102, but this is just an illustrative method. The cooling path 102 may also be formed by general laser drilling or grinding.

Figure 8:
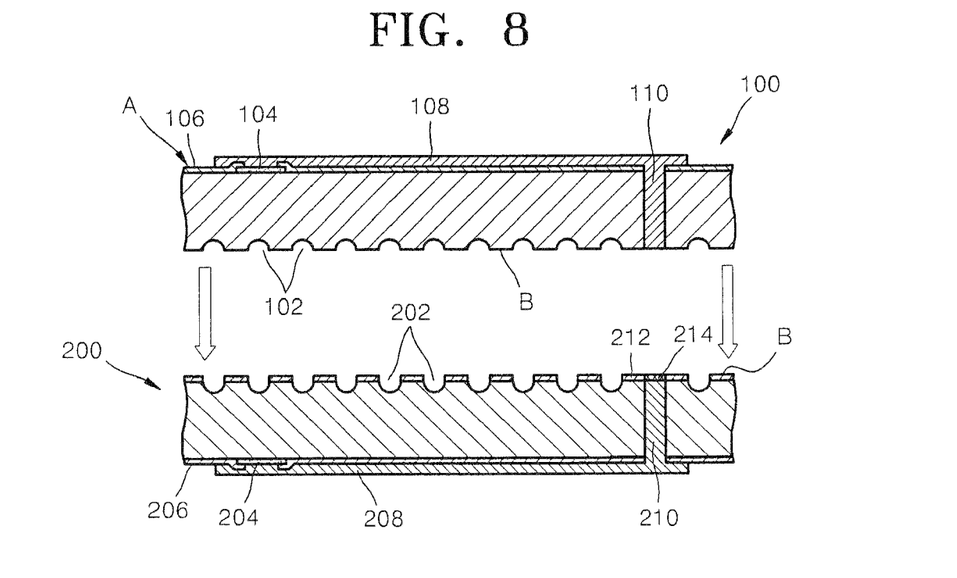
FIGS. 8 and 9 are cross-sectional views of a stack-type semiconductor device having a cooling path according to an embodiment of the invention.
Figure 9:
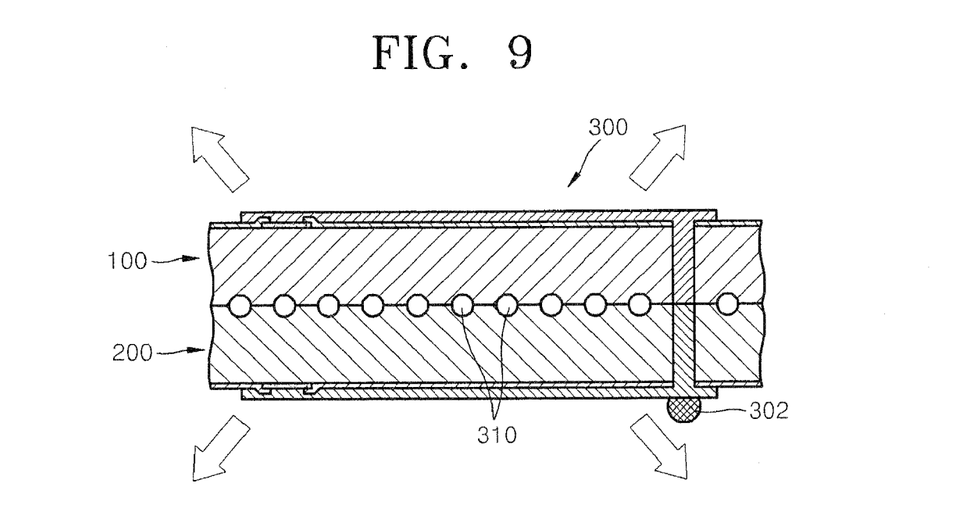

FIGS. 8 and 9 are cross-sectional views of a stack-type semiconductor device having a cooling path according to an embodiment of the invention. Referring to FIGS. 8 and 9, FIG. 8 is a cross-sectional view illustrating the case where two semiconductor devices 100 and 200 are bonded to each other, and FIG. 9 is a cross-sectional view illustrating the case where a terminal for external connection, for example, a solder ball 302, is attached to the bonded semiconductor device when the two semiconductor devices 100 and 200 are completely bonded to each other.

Two semiconductor devices each having the cooling paths 102 and 202, respectively, are aligned and bonded to each other. The cooling paths 102 and 202 in the two semiconductor devices 100 and 200 are aligned with each other. When the two semiconductor devices 100 and 200 are bonded to each other, vertical interconnections 110 and 210 are connected using a conductive adhesion means 214 such as solder paste, and other regions are connected using an insulating adhesion means 212 such as an adhesive tape or liquid epoxy.

Thus, the two semiconductor devices 100 and 200 are bonded to each other so that the second surfaces of the semiconductor devices 100 and 200 face each other. As a result, a third circular cooling path 310 is formed in the middle of a stack-type semiconductor device 300 using the first cooling path 102 in the first semiconductor device 100 and the second cooling path 202 in the second semiconductor device 200. When the stack-type semiconductor device 300 is mounted on an electronic product having a cooling fan, cooling air may flow directly through the third cooling path 310, to effectively dissipate heat generated when the stack-type semiconductor device 300 operates. Although in the described embodiment, the first and second cooling paths 102 and 202 are aligned forming the third circular cooling path 310, it is not necessary for the first and second cooling paths 102 and 202 to be aligned. In other words, the two semiconductor devices 100 and 200 may be bonded together such that the first and second cooling paths 102 and 202 are not aligned. In this case, a third circular cooling path 310 is not formed, but heat can still be removed from the two semiconductor devices 100 and 200 through their respective cooling paths 102 and 202 when the stack-type semiconductor device 300 operates. As an example, the first and second cooling paths 102 and 202 may not be aligned when the first and second cooling paths 102 and 202 have different patterns.

Referring to FIG. 9, the third cooling path 310 may include a plurality of channels. Each of the channels of the third cooling path 310 may have a circular shape. However, the channels of the third cooling path 310 may be formed in various shapes such as a rectangular shape or a polygonal shape.

As described previously, a portion of the second surfaces of the first and second semiconductor devices 100 and 200 may be ground so that the first and second semiconductor devices 100 and 200 have very small thicknesses in the range of 50-100 μm. At this thickness, warpage of the first and second semiconductor devices 100 and 200 would normally occur in the direction in which a circuit unit is generally formed (directions of the arrows in FIG. 9). In other words, due to stresses caused by the layers and materials on the first surface of the semiconductor devices 100 and 200 and defects in the second surfaces of the semiconductor devices 100 and 200 caused by the grinding process, the semiconductor devices 100 and 200 are subject to warpage. This warpage tends to deflect the corners and edges of the semiconductor devices in the directions shown by the arrows in FIG. 9. However, in the invention, warpage in the first and second semiconductor devices 100 and 200 is prevented by bonding the second surfaces of the first and second semiconductor devices 100 and 200. In addition, since the two semiconductor devices 100 and 200 are bonded as one body to effectively double their thickness, warpage effects are effectively suppressed.

Figure 10:
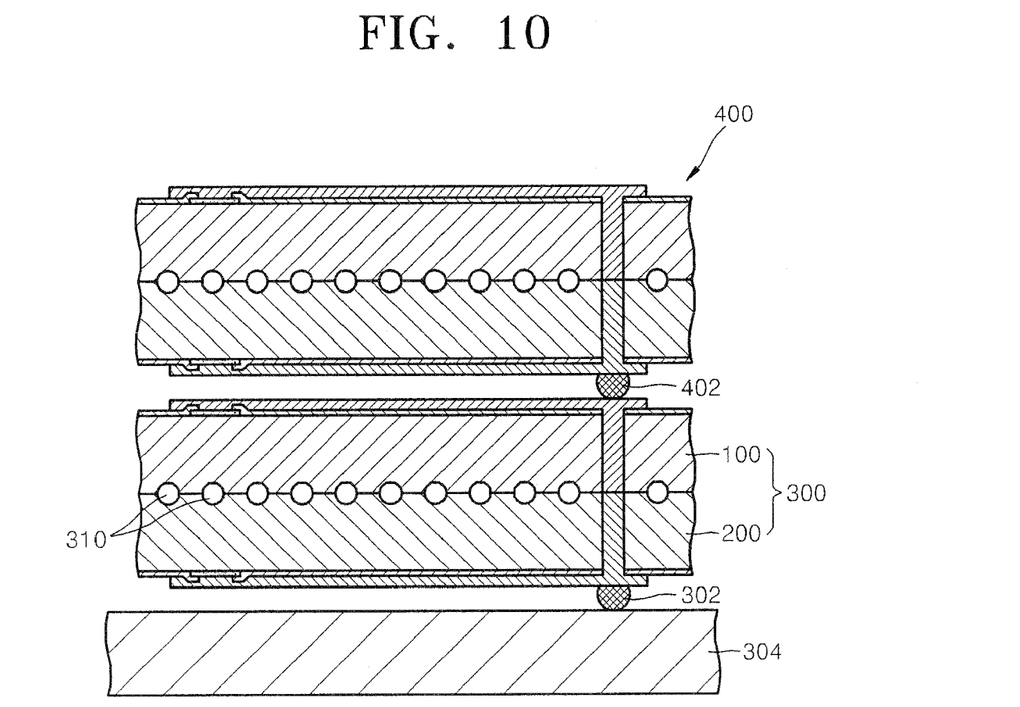
FIG. 10 is a cross-sectional view of an example of a stack-type semiconductor device having a cooling path according to an embodiment of the invention.

FIG. 10 is a cross-sectional view of an example of a stack-type semiconductor device having a cooling path according to an embodiment of the invention. Referring to FIG. 10, another stack-type semiconductor device 400 having the same structure as the stack-type semiconductor device 300 shown in FIG. 9 may be easily stacked on the stack-type semiconductor device 300 of FIG. 9. Specifically, the stack-type semiconductor device 400 could include a third semiconductor device 420 and a fourth semiconductor device 430. Each of the third and fourth semiconductor devices 420 and 430 includes a first surface including a circuit unit and a second surface including a cooling path. The second surface of the third semiconductor device 420 is bonded to the second surface of the fourth semiconductor device 430.

FIG. 10 shows two stack-type semiconductor devices 300 and 400 stacked, but the number of stack-type semiconductor devices may be easily increased. Electrical connection between the stack-type semiconductor devices 300 and 400 is performed by a solder ball 402 attached to the upper stack-type semiconductor device 400.

In addition, the lower stack-type semiconductor device 300 must be electrically connected to a printed circuit board (PCB) 304 so that the stack-type semiconductor devices 300 and 400 can operate. This electrical connection may be performed by a solder ball 302 attached to the lower stack-type semiconductor device 300. The solder balls 302 and 402 may be replaced by solder bumps formed by a plating process.

The PCB 304 may be a substrate used in manufacturing a ball grid array (BGA) package, a PCB used in a memory module, or a main board on which a semiconductor package is mounted. Thus, the stack-type semiconductor device 300 having the cooling path 310 may be applied in a three-dimensional structure to a semiconductor device such as a multi-chip package (MCP) or a system in package (SIP) effectively dissipating heat to the outside.

Figure 11:
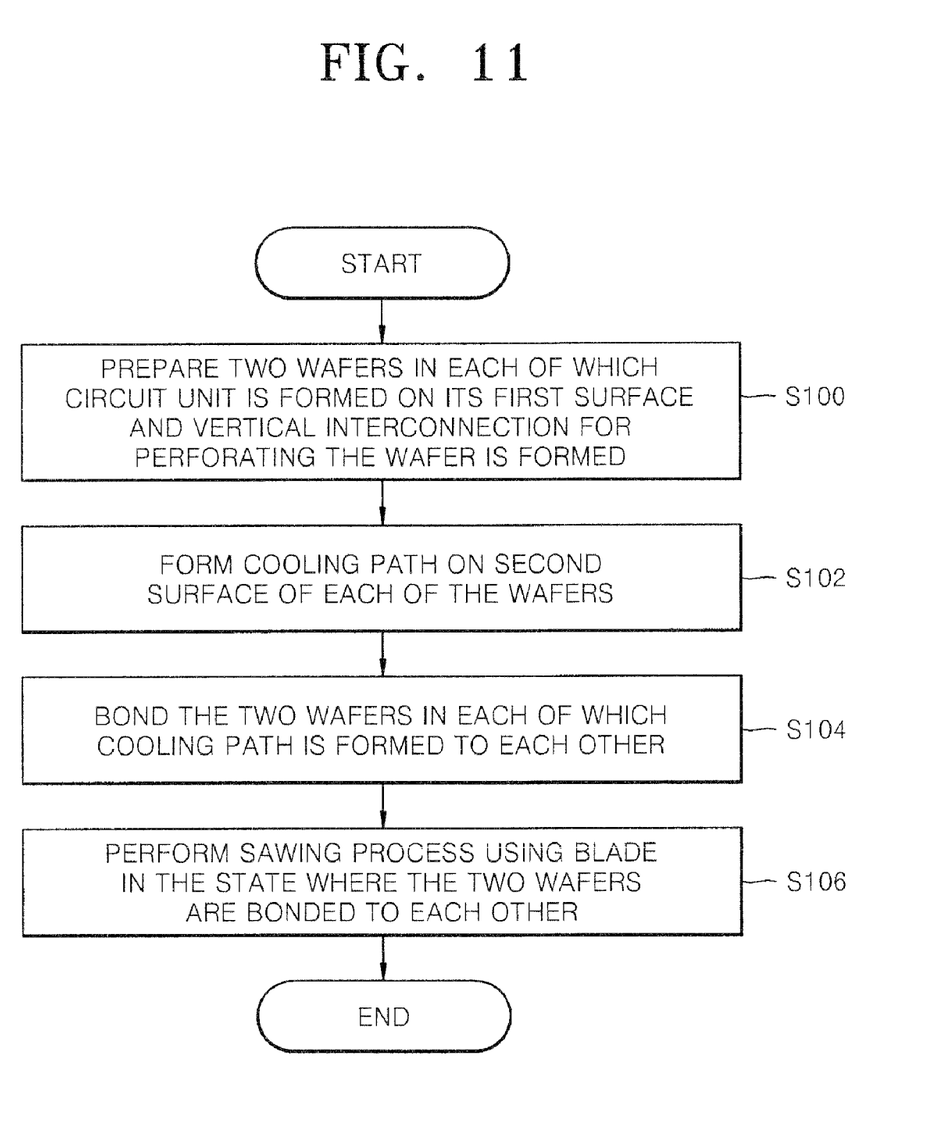
FIGS. 11 and 12 are flowcharts illustrating methods of fabricating a stack-type semiconductor chip having a cooling path according to embodiments of the invention.
Figure 12:
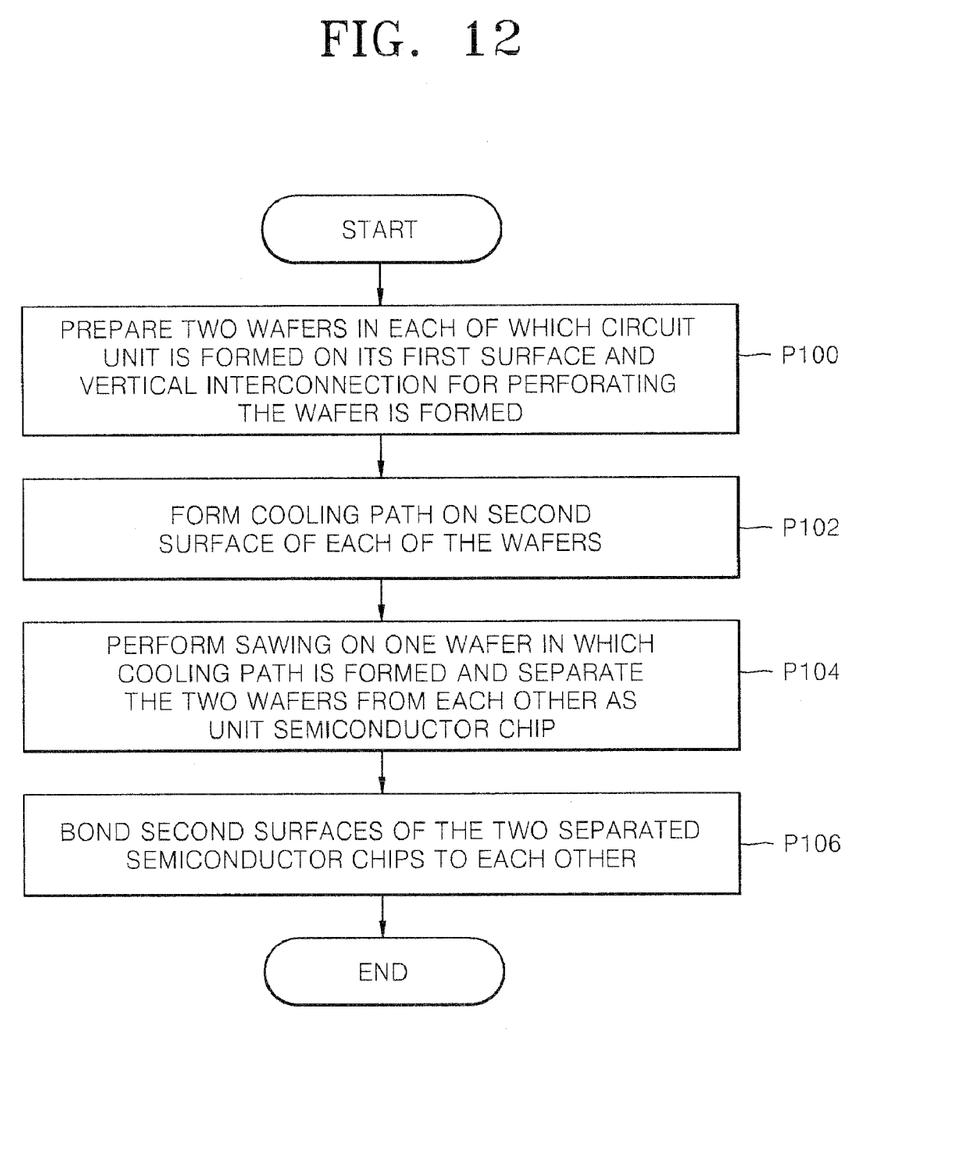

FIGS. 11 and 12 are flowcharts illustrating a method of fabricating a stack-type semiconductor chip having a cooling path according to an embodiment of the invention. Referring to FIGS. 11 and 12, the stack-type semiconductor devices shown in FIGS. 8 and 9 may be fabricated using two methods. In the first method, shown in FIG. 11, two wafers each having a circuit unit formed on a first surface and a vertical interconnection perforating the wafer are prepared in operation S100, and a cooling path is formed on a second surface of each of the wafers using the method described with reference to FIGS. 4 through 7, in operation S102. After that, the two wafers are bonded to each other so that their second surfaces having the cooling paths face each other, in operation S104. Last, a sawing process using a blade is performed on the bonded wafers, in operation S106. In operation S106, the bonded wafers are separated into a plurality of stack-type semiconductor devices.

In the second method for fabricating the stack-type semiconductor device, shown in FIG. 12, two wafers each having a circuit unit formed on a first surface and a vertical interconnection perforating the wafer are prepared in operation P100, and a cooling path is formed on a second surface of each of the wafers using the method described with reference to FIGS. 4 through 7, in operation P102. Subsequently, a sawing process is performed on each wafer and the two wafers are separated into unit semiconductor chips, in operation P104. Last, the second surfaces of the separated semiconductor chips are aligned and bonded to each other, in operation P106.

Thus, according to the invention described above, heat generated in semiconductor chips can be effectively dissipated through the cooling path, thus preventing degradation of the electrical characteristics of the semiconductor device due to heat. Also, since the bottom surfaces of the semiconductor chips are bonded to each other to fabricate a stack-type semiconductor chip, warpage is avoided even though the semiconductor chips are thin.

According to an aspect of the invention, there is provided a semiconductor device having a cooling path, the semiconductor device including: a first surface of a semiconductor chip in which a circuit unit is formed; and a second surface opposite the first surface of the semiconductor chip, and in which a cooling path having a concave shape is formed.

The semiconductor device having a cooling path may further include a vertical interconnection which penetrates the first and second surfaces.

The vertical interconnection may be formed in a bond pad region of the semiconductor chip or may be electrically connected to a bond pad of the semiconductor chip using a pad redistribution pattern and may extend to a scribe lane region of the semiconductor chip.

A cross-section of channels of the cooling path may be approximately semicircular, rectangular or polygonal.

The second surface of the semiconductor device may be ground and the thickness of the semiconductor chip may be in the range of about 50-100 μm. In this case, the cooling path may have an engraved depth in the range of about 1-30 μm.

The cooling path formed on the second surface of the semiconductor chip may be a mesh type.

According to another embodiment of the invention, there is provided a stack-type semiconductor device having a cooling path, the stack-type semiconductor device including: a stack-type semiconductor chip comprising a first semiconductor chip and a second semiconductor chip, the first semiconductor chip comprising a first surface in which a circuit unit is formed and a second surface in which a first cooling path is formed and the second semiconductor chip comprising a first surface in which a circuit unit is formed and a second surface in which a second cooling path is formed, wherein the second surface of the first semiconductor chip and the second surface of the second semiconductor chip are bonded to each other; and a third cooling path formed in the middle of the stack-type semiconductor chip using the first and second cooling paths.

The first and second semiconductor chips of the stack-type semiconductor chip may further include vertical interconnections inside the stack-type semiconductor chip. The vertical interconnections may be connected to each other by solder paste, in the stack-type semiconductor chip.

The channels of third cooling path may have a cross-section of one shape selected from a circular shape, a rectangular shape, and a polygonal shape. The second surfaces of the first and second semiconductor chips may be ground and thicknesses of the first and second semiconductor chips may be in the range of about 50-100 µm.

The stack-type semiconductor device having a cooling path may further include another stack-type semiconductor chip formed on the stack-type semiconductor chip and having the same structure as the stack-type semiconductor chip. The stack-type semiconductor device having a cooling path may further include a printed circuit board (PCB) connected to a lower portion of the stack-type semiconductor chip.

In this case, electrical connection between the stack-type semiconductor chip and the printed circuit board (PCB) may be performed by one selected from a solder ball and a solder bump.

The first and second cooling paths may be formed using one of etching, grinding, and laser drilling.

The stack-type semiconductor chip may be formed by bonding two wafers to each other and then sawing them or by bonding two semiconductor chips which have already been sawed, to each other.

While the invention has been particularly shown and described with reference to exemplary embodiments thereof, it will be understood by those of ordinary skill in the art that various changes in form and detail may be made therein without departing from the spirit and scope of the invention as defined by the following claims.

What is claimed is:

1. A stack-type semiconductor device having a cooling path, the stack-type semiconductor device comprising:
    a stack-type semiconductor chip comprising a first semiconductor chip and a second semiconductor chip, the first semiconductor chip comprising a first surface in which a circuit unit is disposed and a second surface in which a first cooling path is disposed and the second semiconductor chip comprising a first surface in which a circuit unit is disposed and a second surface in which a second cooling path is disposed, wherein the second surface of the first semiconductor chip and the second surface of the second semiconductor chip are bonded to each other; and
    a third cooling path disposed in the stack-type semiconductor chip comprising the first and second cooling paths,
    wherein air or coolant flows through the third cooling path to cool the first and second semiconductor chip.

2. The stack-type semiconductor device having a cooling path of claim 1, wherein the first and second semiconductor chips of the stack-type semiconductor chip further comprise vertical interconnections inside the stack-type semiconductor chip.

3. The stack-type semiconductor device having a cooling path of claim 2, wherein the vertical interconnections are connected to each other by solder paste.

4. The stack-type semiconductor device having a cooling path of claim 1, wherein the third cooling path has a cross-section of one shape selected from a circular shape, a rectangular shape, and a polygonal shape.

5. The stack-type semiconductor device having a cooling path of claim 1, wherein the second surfaces of the first and second semiconductor chips are ground and thicknesses of the first and second semiconductor chips are in the range of about 50-100 µm.

6. The stack-type semiconductor device having a cooling path of claim 1, further comprising another stack-type semiconductor chip disposed on the stack-type semiconductor chip and having substantially the same structure as the stack-type semiconductor chip.

7. The stack-type semiconductor device having a cooling path of claim 1, further comprising a printed circuit board (PCB) connected to a lower portion of the stack-type semiconductor chip.

8. The stack-type semiconductor device having a cooling path of claim 7, wherein an electrical connection between the stack-type semiconductor chip and the printed circuit board (PCB) comprises one selected from a conductive ball and a conductive bump.

9. The stack-type semiconductor device having a cooling path of claim 1, wherein the first and second cooling paths are formed using one of etching, grinding, and laser drilling.

10. The stack-type semiconductor device having a cooling path of claim 1, wherein the stack-type semiconductor chip is formed by bonding two wafers to each other and then sawing the two wafers.

11. The stack-type semiconductor device having a cooling path of claim 1, wherein the stack-type semiconductor chip is formed by bonding two semiconductor chips which have already been sawed, to each other.

12. A semiconductor device having a cooling path, the semiconductor device comprising:
    a first semiconductor chip having a first surface and a second surface opposite the first surface, the first surface including a first circuit unit thereon, the second surface having a first elongated recess formed thereon;
    a second semiconductor chip stacked on the first semiconductor chip, the second semiconductor chip having a third surface and a fourth surface opposite the third surface, the third surface includes a second circuit unit thereon, the fourth surface having a second elongated recess formed thereon, the first and second elongated recesses collectively forming a cooling path,
    wherein air or coolant flows through the cooling path to cool the first and second semiconductor chips.

13. The semiconductor device of claim 12, wherein the cooling path runs parallel to an edge of one of the first and second semiconductor chips.

14. The semiconductor device of claim 13, wherein the cooling path is substantially circular in cross section.

15. The semiconductor device of claim 13, wherein the cooling path forms a mesh pattern.

* * * * *